US010620258B2

United States Patent
Kim et al.

(10) Patent No.: US 10,620,258 B2
(45) Date of Patent: Apr. 14, 2020

(54) METHOD OF TESTING SEMICONDUCTOR DEVICE AND METHOD OF MANUFACTURING A SEMICONDUCTOR DEVICE INCLUDING THE TESTING METHOD

(71) Applicant: Samsung Electronics Co., Ltd., Suwon-si (KR)

(72) Inventors: Jae-hoon Kim, Seoul (KR); Sang-hwan Park, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 9 days.

(21) Appl. No.: 15/855,050

(22) Filed: Dec. 27, 2017

(65) Prior Publication Data

US 2018/0203058 A1    Jul. 19, 2018

(30) Foreign Application Priority Data

Jan. 13, 2017    (KR) .................. 10-2017-0006286

(51) Int. Cl.
| | | |
|---|---|---|
| *G01R 31/26* | (2020.01) |
| *G11C 29/50* | (2006.01) |
| *H01L 21/66* | (2006.01) |
| *G11C 29/06* | (2006.01) |
| *G11C 29/04* | (2006.01) |

(52) U.S. Cl.
CPC .......... *G01R 31/2642* (2013.01); *G11C 29/06* (2013.01); *G11C 29/50004* (2013.01); *H01L 22/14* (2013.01); *G11C 2029/0403* (2013.01); *G11C 2029/5004* (2013.01)

(58) Field of Classification Search
CPC .......... G01R 31/2642; G11C 29/50004; H01L 22/14
USPC .......... 438/17, 14, 18; 257/E21.531; 324/19, 324/762.01, 456, 750.06, 73.1, 750.3, 324/762.05; 716/106
See application file for complete search history.

(56) References Cited

U.S. PATENT DOCUMENTS

| | | | |
|---|---|---|---|
| 5,650,336 A * | 7/1997 | Eriguchi | G01R 31/2879 257/E21.531 |
| 6,077,719 A | 6/2000 | Koike | |
| 8,680,883 B2 | 3/2014 | Cho et al. | |
| 2015/0346271 A1* | 12/2015 | Uppal | G01R 31/2642 324/762.01 |
| 2016/0146879 A1 | 5/2016 | Uppal et al. | |

FOREIGN PATENT DOCUMENTS

| | | |
|---|---|---|
| JP | 1994-334015 | 12/1994 |
| JP | 4040446 B2 | 11/2007 |

(Continued)

*Primary Examiner* — Mouloucoulaye Inoussa
(74) *Attorney, Agent, or Firm* — Muir Patent Law, PLLC

(57) ABSTRACT

A method of testing a semiconductor device includes respectively applying first to n-th voltages that change according to time to first to n-th semiconductor devices that are substantially same until the first to n-th semiconductor devices break down; calculating first to n-th stresses that define the total amount of stress respectively applied to the first to n-th semiconductor devices until a time when the first to n-th semiconductor devices break down, respectively, after the first to n-th voltages are applied; and calculating lifespan of the first to n-th semiconductor devices by using the first to n-th stresses.

20 Claims, 10 Drawing Sheets

(56) References Cited

FOREIGN PATENT DOCUMENTS

| | | |
|---|---|---|
| JP | 4623807 B2 | 11/2010 |
| JP | 2015-152515 | 8/2015 |
| KR | 10-2011-0124589 | 11/2011 |

* cited by examiner

METHOD OF TESTING SEMICONDUCTOR DEVICE AND METHOD OF MANUFACTURING A SEMICONDUCTOR DEVICE INCLUDING THE TESTING METHOD

CROSS-REFERENCE TO RELATED APPLICATION

This application claims the benefit of priority under 35 U.S.C. § 119 to Korean Patent Application No. 10-2017-0006286, filed on Jan. 13, 2017, in the Korean Intellectual Property Office, the disclosure of which is incorporated herein in its entirety by reference.

BACKGROUND

The disclosed embodiments relate to a method of testing a semiconductor device, and more particularly, to a method of testing a semiconductor device to determine the lifespan thereof.

Time dependent dielectric breakdown (TDDB) is one of the breakdown mechanisms of semiconductor devices. TDDB is a mechanism in which an insulator breaks down due to low stress applied thereto for a long time. In order to examine the characteristics of TDDB, stresses such as a voltage, current, heat, or the like of a certain level may be applied to semiconductor devices. For example, when a voltage stress is applied to a semiconductor device, a certain voltage at a similar level to an operating voltage may be applied to the semiconductor device for a long time, and then, the occurrence of a leakage current via an insulator of the semiconductor device may be detected. The leakage current may be generated due to forming of an electron tunneling path via a gate insulating layer.

SUMMARY

The disclosed embodiments provide a method of testing a semiconductor device, with increased reliability and testing speed.

The disclosed embodiments also provide a method of testing a semiconductor device, whereby an electrical defect structure of a semiconductor device may be analyzed.

The disclosed embodiments further provide for methods of manufacturing semiconductor devices using a method of testing a semiconductor device, whereby an electrical defect structure of the semiconductor device may be analyzed.

In some embodiments, the disclosure is directed to a method of testing a semiconductor device to determine a lifespan of the semiconductor device, the method comprising: applying first to n-th voltage sequences to first to n-th semiconductor devices, respectively, until the first to n-th semiconductor devices break down; calculating first to n-th stresses that define a total amount of stress respectively applied to the first to n-th semiconductor devices until a time when the first to n-th semiconductor devices break down, respectively, after the first to n-th voltage sequences are applied; and calculating an expected lifespan of the first to n-th semiconductor devices by using the first to n-th stresses, wherein each of the first to n-th voltage sequences include multiple voltage values that change according to time, and wherein the first to n-th semiconductor devices are a same type.

In some embodiments, the disclosure is directed to a method of testing a semiconductor device during manufacturing, the method comprising: applying first to third voltage sequences, each having a stepwise shape, to first to third semiconductor devices, respectively, until the first to third semiconductor devices break down; and calculating first to third stresses that respectively define a total amount of stress applied until the first to third semiconductor devices break down, wherein highest values of each of the first to third voltage sequences respectively applied to the first to third semiconductor devices is less than respective first to third breakdown voltages, and wherein the first to third breakdown voltages are respective voltages at which the first to third semiconductor devices immediately break down.

In some embodiments, the disclosure is directed to a method of manufacturing semiconductor devices, the method comprising: applying a first voltage sequence to a first semiconductor device until the first semiconductor device breaks down, wherein the first voltage sequence includes multiple first voltage values that change according to time; applying a second voltage sequence to a second semiconductor device until the second semiconductor device breaks down, wherein the second voltage sequence includes multiple second voltage values that change according to time; calculating a first stress that defines a total amount of stress applied to the first semiconductor device until the first semiconductor device breaks down after the first voltage sequence is applied; calculating a second stress that defines a total amount of stress applied to the second semiconductor device until the second semiconductor device breaks down after the second voltage sequence is applied; calculating an expected lifespan of the first and second semiconductor devices based on the first and second stresses; and forming, when the expected lifespan of the first and second semiconductor devices is determined to exceed a desired lifespan, at least one semiconductor chip using at least one of the first and second semiconductor devices.

BRIEF DESCRIPTION OF THE DRAWINGS

The disclosed embodiments will be more clearly understood from the following detailed description taken in conjunction with the accompanying drawings in which.

DETAILED DESCRIPTION OF THE EMBODIMENTS

Figure 1:
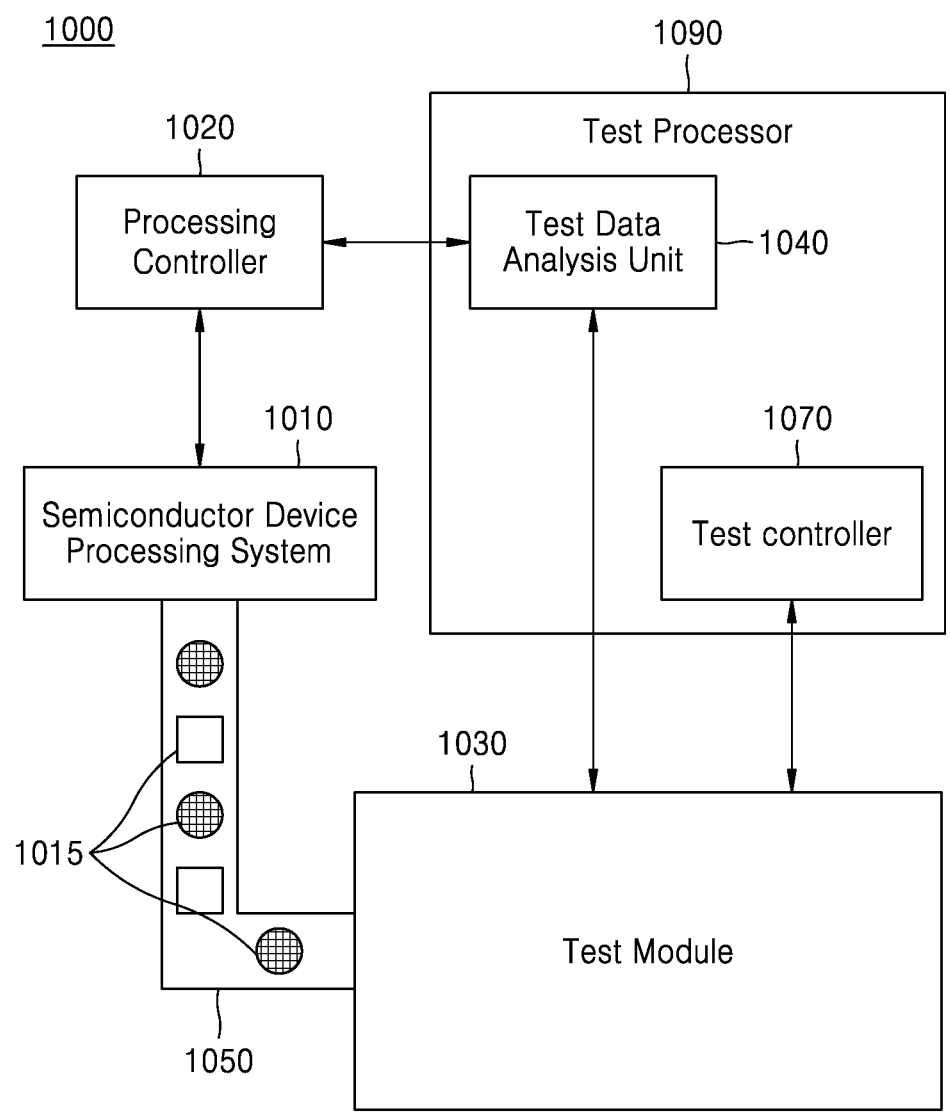
FIG. 1 is a schematic block diagram of a test system including a test processor capable of performing a method of testing a semiconductor device, according to example embodiments.

Hereinafter, the disclosed embodiments will be described in detail with reference to the accompanying drawings. Like reference numerals in the drawings denote like elements throughout, and repeated descriptions thereof will be omitted.

As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. An integrated circuit device may include, for example, a substrate having an integrated circuit thereon, such as a wafer, or a plurality of semiconductor devices formed in an array on a wafer.

An electronic device, as used herein, may refer to these semiconductor devices or integrated circuit devices, and may additionally include products that include these devices, such as a memory module, memory card, hard drive including additional components, or a mobile phone, laptop, tablet, desktop, camera, or other consumer electronic device, etc.

FIG. 1 is a schematic block diagram of a test system 1000 including a test processor 1090 capable of performing a method of testing a semiconductor device, according to example embodiments.

Referring to FIG. 1, the test system 1000 may include a semiconductor device processing system 1010, a processing controller 1020, a test module 1030, a transportation means 1050, and a test controller 1070.

According to example embodiments, the semiconductor device processing system 1010 may include a plurality of stations for manufacturing a semiconductor device 1015. According to example embodiments, the semiconductor device processing system 1010 may include various processing stations such as an etching processing station, a photolithography processing station, and a CMP processing station. The semiconductor device processing system 1010 may manufacture semiconductor devices 1015 and provide the semiconductor devices 1015 to the transportation means 1050.

The processing controller 1020 may control the semiconductor device processing system 1010. The processing controller 1020 may be a computing device such as a workstation computer, a desktop computer, a laptop computer, a tablet computer, or the like. The processing controller 1020 may include software that performs functions such as receiving processing feedback, receiving test data, and coordinating processing.

Although not illustrated, the processing controller 1020 can include one or more of the following components: at least one central processing unit (CPU) configured to execute computer program instructions to perform various processes and methods, random access memory (RAM) and read only memory (ROM) configured to access and store data and information and computer program instructions, input/output (I/O) devices configured to provide input and/or output to the processing controller 1020 (e.g., keyboard, mouse, display, speakers, printers, modems, network cards, etc.), and storage media or other suitable type of memory (e.g., such as, for example, RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives, any type of tangible and non-transitory storage medium) where data and/or instructions can be stored. In addition, the processing controller 1020 can include antennas, network interfaces that provide wireless and/or wire line digital and/or analog interface to one or more networks over one or more network connections (not shown), a power source that provides an appropriate alternating current (AC) or direct current (DC) to power one or more components of the processing controller 1020, and a bus that allows communication among the various disclosed components of the processing controller 1020.

According to example embodiments, the semiconductor devices 1015 may include a semiconductor wafer or a group of semiconductor wafers, for example, a semiconductor wafer lot. The semiconductor devices 1015 may include a transistor and/or at least one insulating layer. According to example embodiments, the insulating layer may include at least one of silicon oxide ($SiO_2$), silicon nitride (SiN), and silicon oxynitride (SiON). According to example embodiments, the semiconductor devices 1015 may include a transistor, a capacitor, a resistor, or a memory cell. According to example embodiments, the semiconductor devices 1015 may include a transistor, and the insulating layer may correspond to a gate insulating layer for the transistor. According to example embodiments, the semiconductor device may include a magnetic tunneling junction, and the insulating layer may correspond to a tunneling barrier between a fixed layer and a free layer.

The transportation means 1050 may be a sophisticated clean room transportation system capable of transporting the semiconductor devices 1015 manufactured in the semiconductor device processing system 1010. The transportation means 1050 may include, for example, a conveyor system. The transportation means 1050 may provide the semiconductor device 1015 to the test module 1030.

The test module 1030 may include one or more test stations capable of performing various insulation tests with respect to the semiconductor devices 1015. The semiconductor devices 1015 may be loaded to each test station. The test module 1030 may perform a bias temperature instability test, a time dependent dielectric breakdown test, a hop carrier test, and the like, but example embodiments are not limited thereto.

The test module 1030 may include a test signal generator (not shown). The test signal generator may provide a test signal that changes according to time. The test signal may include, for example, a voltage, a current, etc. The test signal generator is capable of setting a time at which the test signal changes with some degree of precision. When the test signal generator maintains a certain test signal for a predetermined time interval, the test signal generator may precisely set the predetermined time signal.

According to example embodiments, the test module 1030 may detect various breakdown characteristics of the semiconductor device 1015 that is being tested. The test module 1030 may also detect various threshold shift characteristics of an integrated circuit being tested. According to example embodiments, the test module 1030 may provide test data related to a breakdown of the insulating layer of the semiconductor device 1015 that is being tested and/or at least one characteristic of the transistor included in the semiconductor device 1015. The test module 1030 may use test data to compare degradation of linear and saturation drain current, linear and saturation critical voltage, and other electrical parameters.

The test processor 1090 may include a test data analysis unit 1040 that analyzes test data received from the test module 1030 and the test controller 1070 that controls the test module 1030.

According to example embodiments, the test data analysis unit 1040 may compare, based on the test data, numerical values such as a voltage, a current, and a time where a breakdown has occurred with a predetermined breakdown level or critical values. According to example embodiments, the test data analysis unit 1040 may compare a shift of critical voltages with a predetermined shift level or critical values. According to example embodiments, a comparison may be made by using a lookup function regarding data stored in the test system 1000 and/or comparison with offline data. According to example embodiments, a comparison of a voltage, a current, a time where a breakdown has occurred, and critical voltage shifts with reference values may be based on reference values input from an external source.

The test data analysis unit 1040 may provide analysis data, which is data obtained by analyzing the received test data, to the processing controller 1020. The processing controller 1020 may transmit, based on the analysis data, a feedback signal to the semiconductor device processing system 1010. The semiconductor device processing system 1010 may coordinate and/or select processes which are performed based on the feedback signal. The feedback signal may be based on a wafer-to-wafer rule or a lot-to-lot rule. Alternatively, the feedback signal may be based on a difference between wafers in one lot. In this regard, when the feedback signal is based on a wafer-to-wafer rule, the semiconductor device 1015 that is a target of measurement corresponds to a wafer, and thus, subsequent processes of the semiconductor devices 1015 corresponding to wafers are coordinated. Likewise, when the feedback signal is based on a lot-to-lot rule, the semiconductor device 1015 that is a target of measurement corresponds to a lot, and thus, subsequent processes of the semiconductor devices 1015 corresponding to lots are coordinated.

Providing feedback in such a manner may be performed based on a period of a reliability test which is performed by the test module 1030. The feedback may influence various parameters used to perform and/or select a process for providing the semiconductor device 1015. For example, test data measured by the test data analysis unit 1040 may be provided to the processing controller 1020. Afterwards, the processing controller 1020 may coordinate one or more processing parameters and/or select a processing set from a plurality of processing sets by using analysis data. Examples of the processing parameter may include a temperature, a pressure, a duration time, a processing gas composition, a processing gas concentration, and an applied voltage of a processing operation, but example embodiments are not limited thereto.

The test module 1030 may be controlled by the test controller 1070. According to example embodiments, the test controller 1070 is adjacent to the test module 1030, but example embodiments are not limited thereto. For example, the test controller 1070 and the test module 1030 may be physically co-located in a single physical chassis or cabinet, or the test controller 1070 and the test module 1030 may be physically separate and may be distant from one another (e.g., different locations). According to example embodiments, the test controller 1070 may be a computing device including one or more software products capable of controlling an operation of the test module 1030, such as a workstation computer, a desktop computer, a laptop computer, or a tablet computer.

Although not illustrated, each of the test data analysis unit 1040 and the test controller 1070 can include one or more of the following components: at least one central processing unit (CPU) configured to execute computer program instructions to perform various processes and methods, random access memory (RAM) and read only memory (ROM) configured to access and store data and information and computer program instructions, input/output (I/O) devices configured to provide input and/or output to the test data analysis unit 1040 or the test controller 1070 (e.g., keyboard, mouse, display, speakers, printers, modems, network cards, etc.), and storage media or other suitable type of memory (e.g., such as, for example, RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives, any type of tangible and non-transitory storage medium) where data and/or instructions can be stored. In addition, each of the test data analysis unit 1040 and the test controller 1070 can include antennas, network interfaces that provide wireless and/or wire line digital and/or analog interface to one or more networks over one or more network connections (not shown), a power source that provides an appropriate alternating current (AC) or direct current (DC) to power one or more components of the test data analysis unit 1040 and the test controller 1070, and a bus that allows communication among the various disclosed components of the test data analysis unit 1040 and the test controller 1070.

The test system 1000 may perform a test regarding various semiconductor devices involving various technologies. For example, the test system 1000 may perform a test regarding memory devices such as a complementary metal oxide semiconductor (CMOS) device, a flash device, a BiCMOS device, a power device, a static random access memory (SRAM) memory device, a magnetoresistive RAM (MRAM) memory device, and resistive RAM (ReRAM), a dynamic RAM (DRAM) memory device, a NAND memory device, a VNAND memory device, and other various memory devices.

Figure 2:
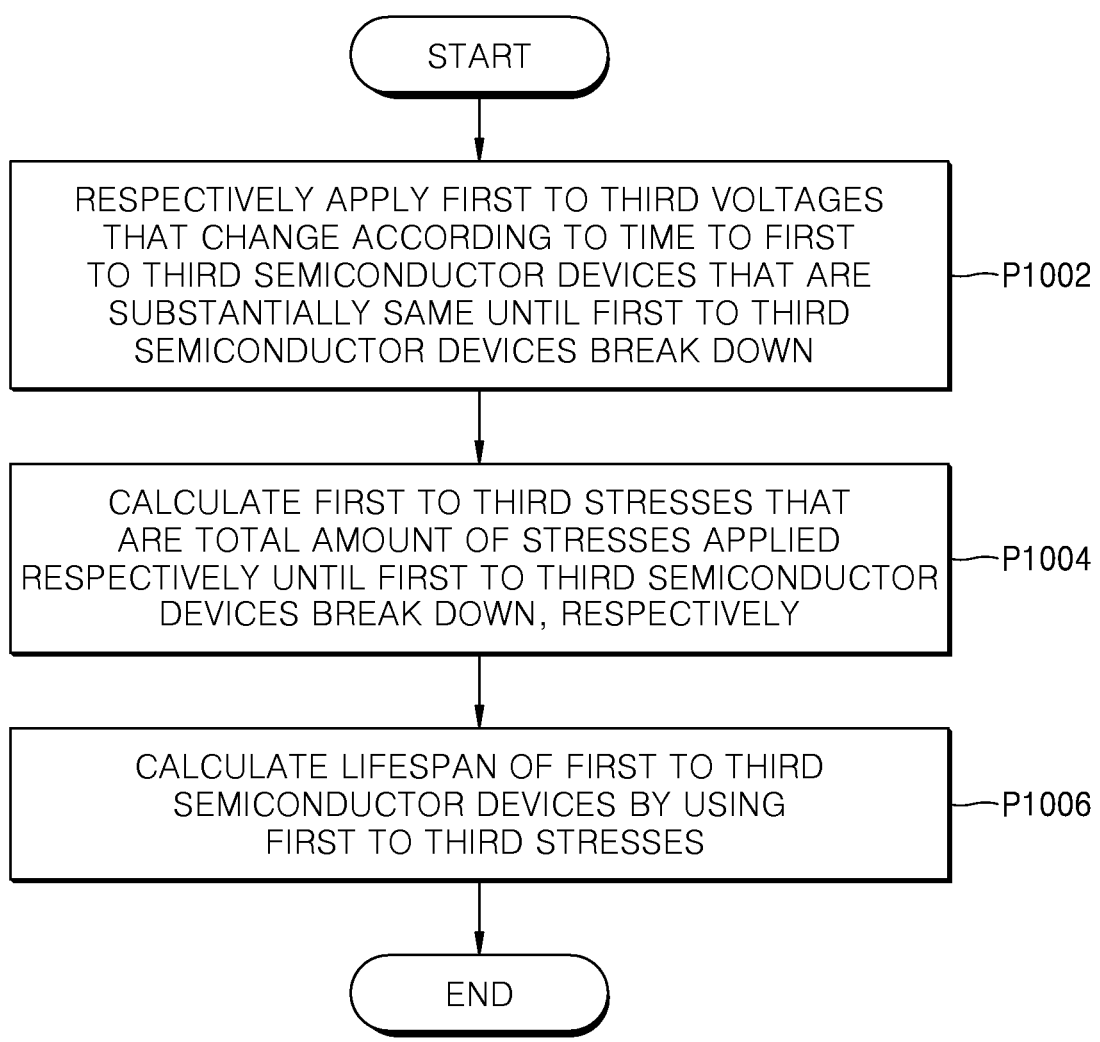
FIG. 2 is a flowchart of a method of testing a semiconductor device, according to example embodiments.
Figure 3:
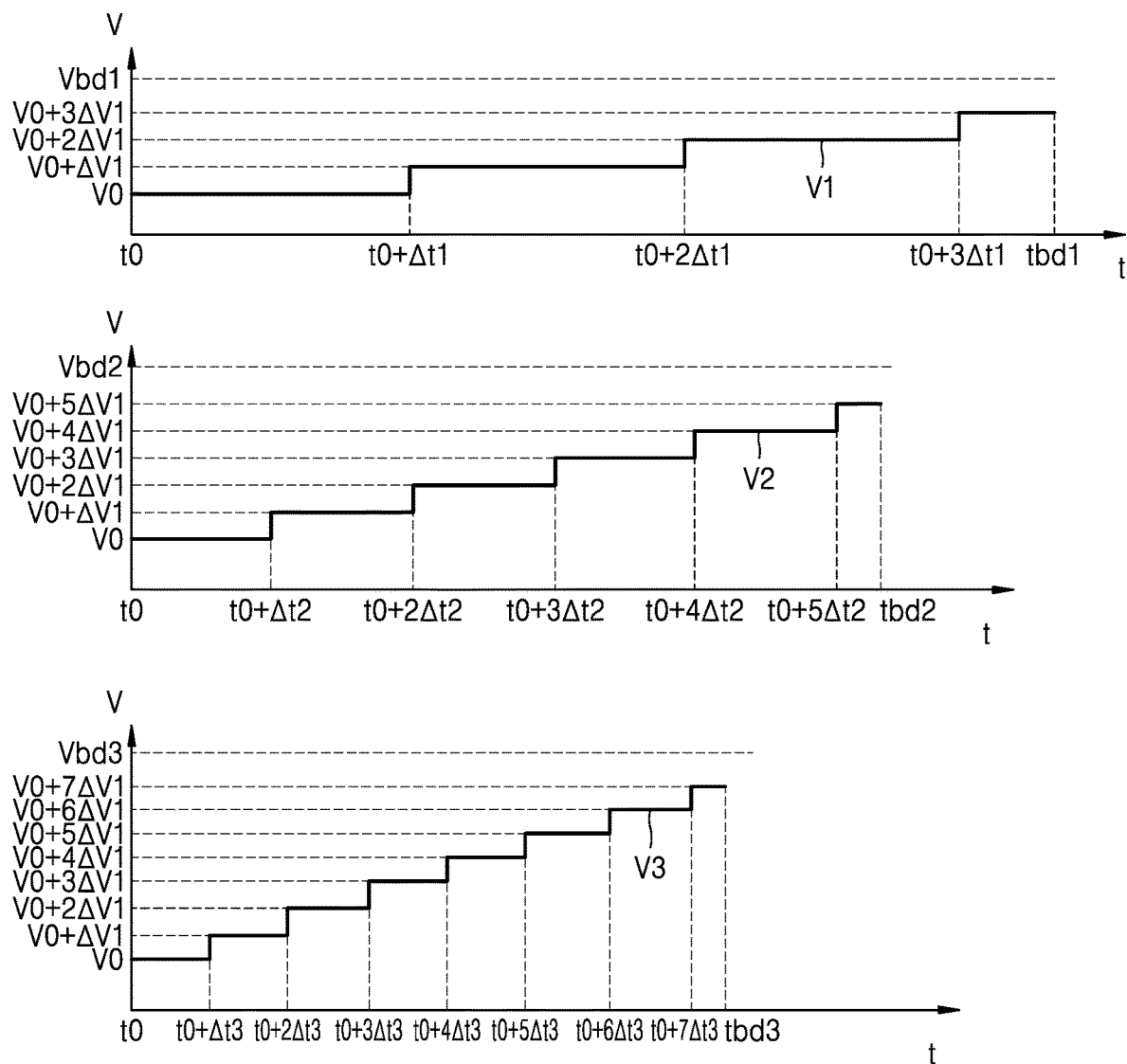
FIG. 3 is a graph for describing voltages that may be applied to a semiconductor device according to a method of testing a semiconductor device, according to example embodiments.
Figure 4:
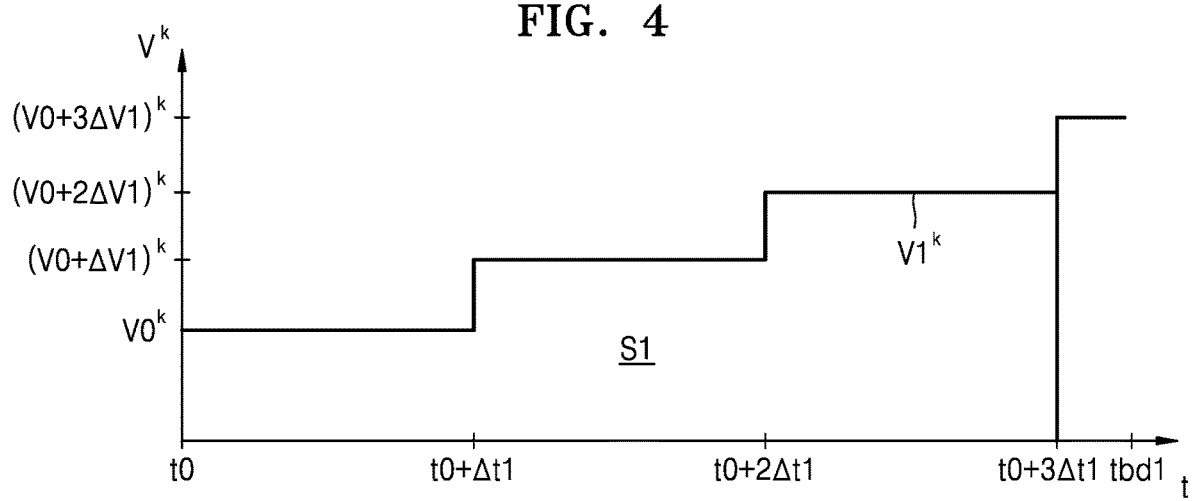
FIG. 4 is a graph for describing a stress that is applied to a semiconductor device according to a method of testing a semiconductor device, according to example embodiments.
Figure 4:
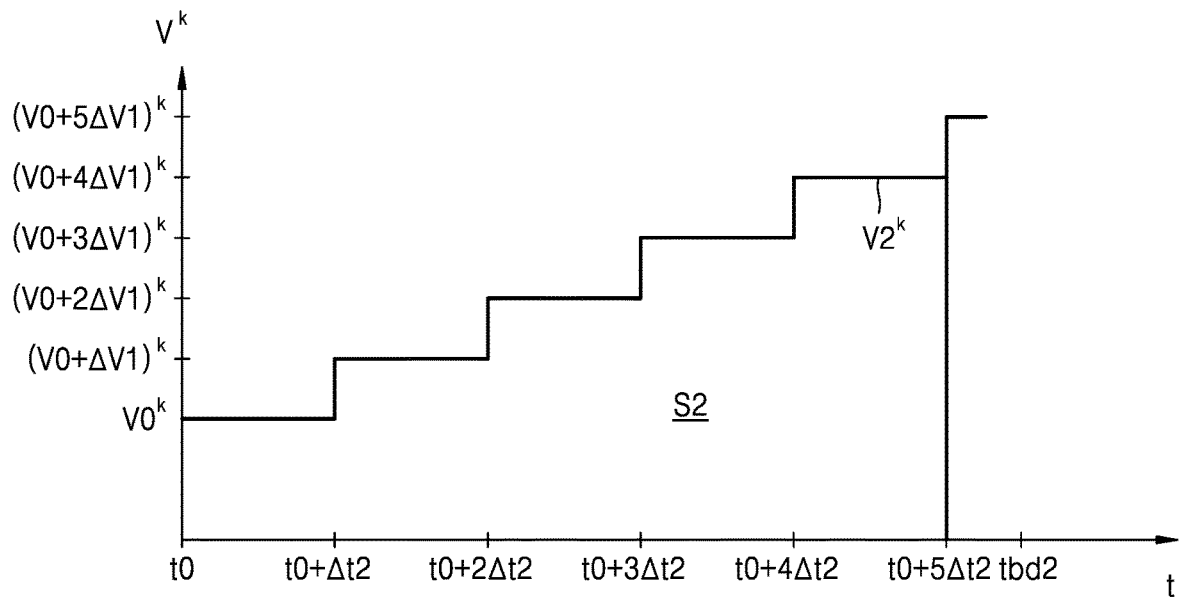
Figure 4:
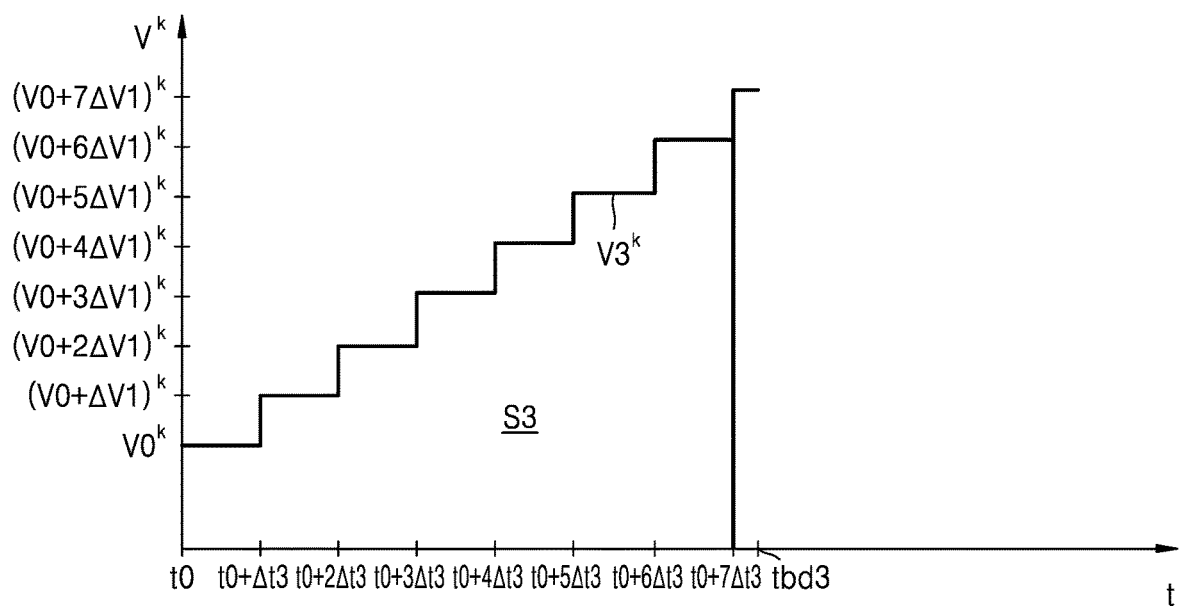

FIG. 2 is a flowchart of a method of testing a semiconductor device, according to example embodiments. FIG. 3 are graphs for describing a voltage function that may be used in a method of testing a semiconductor device, according to example embodiments. FIG. 4 are graphs for describing a process of obtaining a stress according to the voltage function of FIG. 3.

Referring to FIGS. 2 and 3, in process P1002, first to third voltage sequences V1, V2, and V3 may be respectively applied to first to third semiconductor devices. For example, first to third voltage sequences V1, V2, and V3 may be applied to first to third semiconductor devices, respectively (e.g., a first voltage sequence V1 applied to a first semiconductor device, a second voltage sequence V2 applied to a second semiconductor device, and a third voltage sequence V3 applied to a third semiconductor device). The first to third voltage sequences V1, V2, and V3 may be voltages that are applied across the gate electrode and the channel region of the semiconductor device 1015, or across two electrodes of the semiconductor device 1015.

The first to third voltage sequences may be applied concurrently to the first to third semiconductor devices. For example, the start time at which the first to third voltage sequences are applied to the first to third semiconductor devices may be the same. The term "breakdown" may be used, for example, to describe when an insulating layer of the semiconductor device 1015 loses its electrical insulating properties, thereby causing the gate and channel or the upper and lower electrodes sandwiching the insulating layer to be electrically short-circuited.

The first to third semiconductor devices may be substantially the same as one another. For example, the first to third semiconductor devices may be a same type of device, each having insulating layers that are substantially the same in shape, size, and production processes with one another. Although in FIG. 3, the three voltage sequences V1, V2, and V3 corresponding to three semiconductor devices, respectively, are shown for convenience of description, example embodiments are not limited thereto. For example, two or four or more semiconductor devices may be tested, and two or four or more voltage sequences may be applied correspondingly. The number of voltage sequences applied may be equal to the number of semiconductor devices being tested. The number of semiconductor devices under test may be less than the total number of semiconductor devices formed on a wafer (e.g., a sample set of semiconductor devices). When the number of parameters of semiconductor devices that are tested is increased or the number of semiconductor devices under test is increased (e.g., an increased sample size), reliability of test data may be increased, and as will be described later, an electrical defect structure of semiconductor devices may also be analyzed.

According to example embodiments, the first to third voltage sequences V1, V2, and V3 may be functions of time, and may be applied in such a manner that a predetermined initial voltage V0 that is applied at an initial time t0 changes according to time. In this regard, the initial time t0, which is a point of time at which the first to third voltage sequences V1, V2, and V3 start to be applied, may be a reference point of a semiconductor device test. For example, each of the first to third voltage sequences V1, V2, and V3 may be understood to be a continuous application of voltage to a device under test, where the voltage value (or the applied voltage) may change over time. The initial voltage V0, which is a voltage where time zero dielectric breakdown (TZDB) does not occur, may be derived from pieces of predetermined existing experiment data so as to fit the purpose of the test to be conducted.

According to example embodiments, the first to third voltage sequences V1, V2, and V3 may be functions of time, each including a monotonically increasing section. In this regard, the term "monotonically increasing" means that a function value does not decrease in a predetermined section (e.g., a predetermined interval). However, example embodiments are not limited thereto, and the first to third voltage sequences V1, V2, and V3 may be functions of time, each including a decreasing section. According to example embodiments, the first to third voltage sequences V1, V2, and V3 may be functions of time including a section where a differential coefficient of the first to third voltage sequences V1, V2, and V3 with respect to time is 0 or greater. According to example embodiments, the first to third voltage sequences V1, V2, and V3 may be functions of time and may monotonically increase during the entire application time, but example embodiments are not limited thereto. According to example embodiments, a differential coefficient of the first to third voltage sequences V1, V2, and V3 may be 0 or greater during the entire application time.

According to example embodiments, the first to third voltage sequences V1, V2, and V3 may be stepwise monotonically increasing functions. Values of the first to third voltage sequences V1, V2, and V3 may respectively increase at every first, second, and third time intervals $\Delta t1$, $\Delta t2$, and $\Delta t3$. According to example embodiments, each of the first to third time intervals $\Delta t1$, $\Delta t2$, and $\Delta t3$ may be about 1 ms to about 10 s, but example embodiments are not limited thereto.

According to example embodiments, the first to third time intervals $\Delta t1$, $\Delta t2$, and $\Delta t3$ may be lengths of time that are different from one another. For convenience of description, the first to third time intervals $\Delta t1$, $\Delta t2$, and $\Delta t3$ are assumed to have increasingly smaller values in this stated order. For example, the first time interval $\Delta t1$ may be equal to or greater than the second time interval $\Delta t2$, and the second time interval $\Delta t2$ may be equal to or greater than the third time interval $\Delta t3$.

According to example embodiments, an increase value of the first to third voltage sequences V1, V2, and V3 may be substantially the same as a first voltage interval $\Delta V1$. For example, each of the first to third voltage sequences V1, V2, and V3 may be increased by the first voltage interval $\Delta V1$ one or more times. The first voltage interval $\Delta V1$ may be about 10 μV to about 0.01 V, but example embodiments are not limited thereto.

According to example embodiments, the first to third voltage sequences V1, V2, and V3 may be defined according to Equation 1 below.

$$V1(t) = V0 \cdot u(t-t0) + \sum_{n=1}^{} \Delta V1 \cdot u(t - n\Delta t1 - t0) \quad \text{Equation 1}$$

$$V2(t) = V0 \cdot u(t-t0) + \sum_{n=1}^{} \Delta V1 \cdot u(t - n\Delta t2 - t0)$$

$$V3(t) = V0 \cdot u(t-t0) + \sum_{n=1}^{} \Delta V1 \cdot u(t - n\Delta t3 - t0)$$

$$u(t) = \begin{cases} 0 & (t < 0) \\ 1 & (t \geq 0) \end{cases}$$

In Equation 1, n is an integer.

The first to third voltage sequences V1, V2 and V3 may be respectively applied to the first to third semiconductor devices until the first to third semiconductor devices break down. In this regard, maximum values of the first to third voltage sequences V1, V2 and V3 may be less than respective first to third breakdown voltages Vbd1, Vbd2, and Vbd3, which are voltages at which the respective first to third semiconductor devices immediately break down. In this regard, the voltages at which the first to third semiconductor devices immediately break down are voltages where TZDB occurs. TZDB is a mechanism in which an insulating material included in a semiconductor device immediately breaks down due to a strong electric field. Since the first to third semiconductor devices are substantially the same as one another, the first to third breakdown voltages Vbd1, Vbd2, and Vbd3 may also be substantially the same as one another. The term "substantially the same as one another" may mean exactly the same or equal, or may mean the same or equal within acceptable variations that may occur, for example, due to manufacturing processes or processing tolerances.

In the case of FIG. 3, the third voltage sequence V3 may increase the most rapidly, and accordingly, the maximum value of the third voltage sequence V3 may be greater than the maximum values of the first and second voltage sequences V1 and V2. For example, the periods of time between voltage increases for the third voltage sequence V3 may be shorter than for those of the first and second voltage sequences V1 and V2, and the number of voltage increases for third voltage sequence V3 may be greater than for those of the first and second voltage sequences V1 and V2. In the example of FIG. 3, seven (7) first voltage intervals ΔV1 (i.e., 7 ΔV1) may be applied to the third voltage sequence V3, which results in the maximum value of the third voltage sequence V3 being V0+7 ΔV1. Referring to FIG. 3, the maximum value of the third voltage sequence V3 (i.e., V0+7 ΔV1) may be less than the first to third breakdown voltages Vbd1, Vbd2, and Vbd3. First to third breakdown times tbd1, tbd2, and tbd3, which are times at which the first to third semiconductor devices break down, may be different from one another. Since an average rate at which the first voltage sequence V1 is increased is the lowest, the first breakdown time tbd1 may occur the latest. In this regard, the first to third breakdown times tbd1, tbd2, and tbd3 may be determined by whether a current flowing through the first to third semiconductor devices exceeds a predetermined value.

Although initial voltage values of the first to third voltage sequences V1, V2 and V3 are shown as being the same (i.e., V0), example embodiments are not limited thereto. All of the initial times t0 being the same means that testing begins simultaneously for the first to third semiconductor devices. In this case, a test speed may increase in proportion to the number of source measuring units (SMUs). In time dependent dielectric breakdown (TDDB) of the related art, it may take a lot of time t0 test each semiconductor device, and dispersion of test times according to voltage values is large, and thus, a plurality of tests may not be performed simultaneously.

In the method of testing a semiconductor device according to example embodiments, voltages increasing according to time are applied to respective semiconductor devices, and thus, a time required for testing becomes shorter. Accordingly, a plurality of semiconductor devices may be tested simultaneously. For example, a single wafer provided to the test module 1030 may include a plurality of semiconductor devices, and the method disclosed herein may operate on a subset (e.g., a sample) of the plurality of semiconductor devices on the same single wafer. However, example embodiments are not limited thereto, and initial times at which voltages start to be applied to respective semiconductor devices may be different from one another. Accordingly, the respective semiconductor devices may be tested independently of one another.

FIG. 4 show exemplary graphs for describing a simulation process for obtaining first to third stresses.

Referring to FIGS. 2 and 4, in process P1004, first to third stresses S1, S2, and S3, which define the total amount of stress applied to the first to third semiconductor devices, respectively, may be obtained.

In this regard, the first to third stresses S1, S2, and S3 may be defined according to Equation 2 below.

$$S1 = \int (V1(t))^k dt$$

$$S2 = \int (V2(t))^k dt$$

$$S3 = \int (V3(t))^k dt \qquad \text{Equation 2:}$$

In this regard, a power (k), which is a constant value, is a value at which the first to third stresses S1, S2, and S3 have substantially the same value. When the first to third voltage sequences V1, V2 and V3 respectively change within predetermined voltage ranges, the first to third stresses S1, S2, and S3 may have substantially the same value. These predetermined voltage ranges may have different ranges according to types of semiconductor devices and may be derived from pieces of existing experiment data. As described above, with respect to the predetermined initial voltage V0, when each of the first to third time intervals Δt1, Δt2, and Δt3 is about 1 ms to about 10 s, and first to third voltage intervals ΔV1, ΔV2, and ΔV3 are 10 μV to 0.01 V, the first to third stresses S1, S2, and S3 may be substantially the same as one another.

Since FIG. 4 shows changes of the k-th powers (that is, $V1^k$, $V2^k$, and $V3^k$) of the first to third voltage sequences V1, V2, and V3 according to time, lower areas thereof may be the first to third stresses S1, S2, and S3 defined by Equation 2. Referring to FIG. 4, the first to third stresses S1, S2, and S3 may be calculated by summing up stresses of the respective semiconductor devices from the initial time to times right before the first to third breakdown times tbd1, tbd2, and tbd3, at which time the values of the first to third voltage sequences V1, V2, and V3 have changed. This is because a time between the times right before the first to third breakdown times tbd1, tbd2, and tbd3, at which time the values of the first to third voltage sequences V1, V2, and V3 have changed and the first to third breakdown times tbd1, tbd2, and tbd3 is sufficiently short and thus may be approximately ignored. For example, the first to third stresses S1, S2, and S3 may be measured by excluding stresses due to voltages from t0+3 Δt1 to the first breakdown time tbd1 with respect to the first voltage function V1(t), excluding stresses due to voltages from t0+5 Δt2 to the second breakdown time tbd2 with respect to the second voltage function V2(t), and excluding stresses due to voltages from t0+7 Δt3 to the third breakdown time tbd3 with respect to the third voltage function V3(t).

Figure 5:
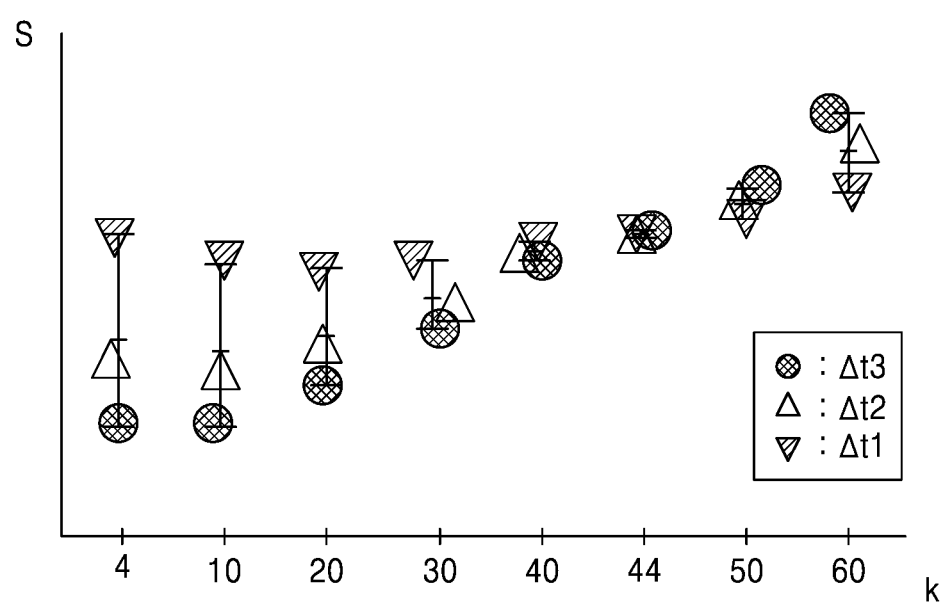
FIG. 5 is a graph for describing a method of testing a semiconductor device, according to example embodiments.

FIG. 5 is a graph showing values of the first to third stresses S1, S2, and S3 according to a k value.

Referring to FIGS. 2 and 5, in process P1004, a k value for measuring the first to third stresses may be obtained. The k value at which the first to third stresses S1, S2, and S3 are substantially the same is found by simulating the first to third stresses S1, S2, and S3 while changing a value of k. Referring to FIG. 5, the first to third stresses S1, S2, and S3 become substantially the same at k=44, and accordingly, the value of k may be determined as being equal to 44. According to example embodiments, the value of k is not limited to being an integer and may be any positive real number.

Figure 6A:
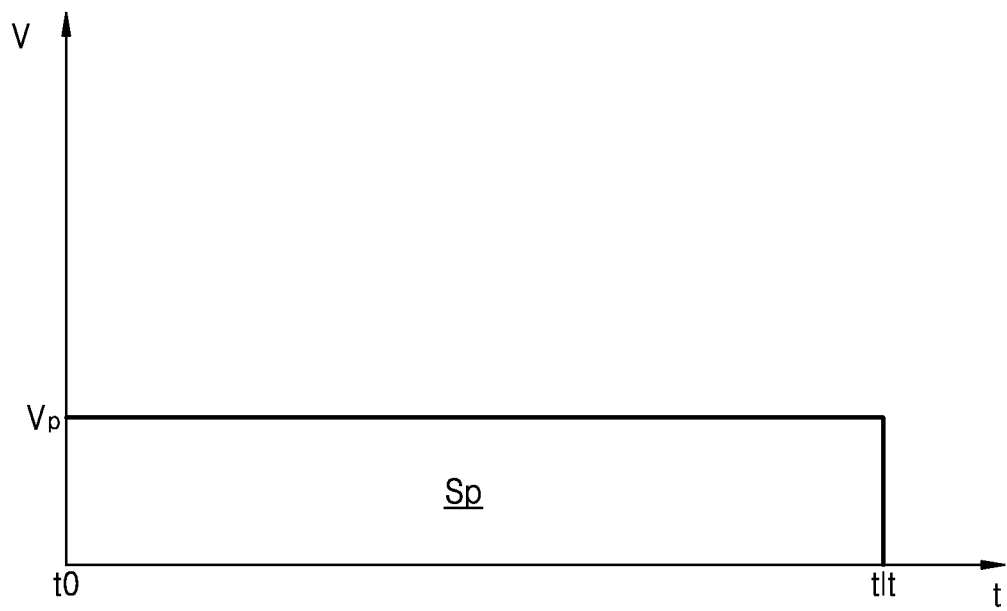
FIGS. 6A and 6B are graphs for describing a method of testing a semiconductor device, according to example embodiments.

FIG. 6A is a graph for describing a process of inverse-calculating an estimated lifespan of a semiconductor device. Referring to FIGS. 6A and 2, in process P1006, a lifespan of a semiconductor device may be inversely calculated.

Referring to FIG. 6A, a usage voltage Vp is applied to the semiconductor device. The usage voltage Vp may correspond to a voltage that is applied to the semiconductor device when a consumer uses a product including the semiconductor device. In this case, a product stress Sp, which is the total amount of stress applied to the semiconductor device during a product lifespan tlt, is determined according to Equation 3.

$$Sp = \int_{t0}^{tlt} Vp^k(t)dt \qquad \text{Equation 3}$$

In some exemplary embodiments, the product lifespan tlt may be, for example, a common warranty period of the product including the semiconductor device or any predetermined period of time. Also, the product stress Sp defined by Equation 3 may be obtained via simulation based on a predetermined usage voltage Vp and a k value calculated by using the method described with reference to FIG. 5. Referring to FIG. 6A, the usage voltage Vp is shown as a constant value but is not limited thereto.

The test processor 1090 (refer to FIG. 1) may perform a processing evaluation based on the product stress Sp, and transmit a feedback signal to the semiconductor device processing system 1010 (refer to FIG. 1). For example, when the product stress Sp is less than the previously obtained first to third stresses S1, S2, and S3, an expected lifespan of the semiconductor device may be determined to be longer than the product lifespan tlt. Accordingly, semiconductor processing is evaluated as working normally, and current processing may be maintained. On the other hand, for example, when the product stress Sp is greater than the previously obtained first to third stresses S1, S2, and S3, an expected lifespan of the semiconductor device may be determined to be shorter than the product lifespan tlt. Accordingly, the test processor 1090 (refer to FIG. 1) may receive a feedback signal including a determination of the processing evaluation (e.g., longer lifespan or shorter lifespan). When the test processor 1090 receives a processing evaluation indicating a shorter lifespan, the test processor 1090 may proceed to identify and fix a processing problem that may be the cause of the shorter lifespan. For example, in a mass production environment (e.g., a manufacturing facility), the disclosed embodiments may identify situations in which a process condition is changed due to trouble of a production machine or the like such that the semiconductor devices vary in the lifetime of the insulating layer of the semiconductor device. In some cases, there may be produced a wafer having an insulating layer of which lifetime is too short to satisfy the standards for assuring the reliability, and the wafer under test may be discarded or destroyed. If such an abnormality occurs, the disclosed embodiment may provide for a quick and accurate estimation of the lifespan of the semiconductor devices, and thereby prevent semiconductor devices having a low reliability from being delivered from the manufacturing facility to the market.

In some exemplary embodiments, when the processing evaluation indicates a longer lifespan, the test processor 1090 may allow the semiconductor devices (including semiconductor devices that may be represented by a sample including the semiconductor devices being tested) to proceed for further manufacturing and/or processing, and thereafter be included in electronic devices.

Figure 6B:
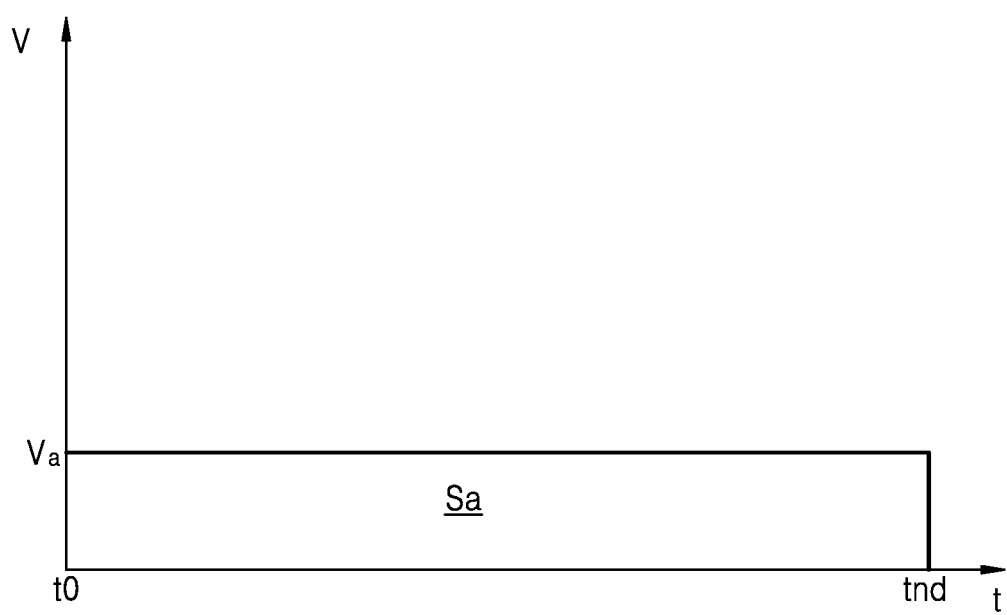

Unlike FIG. 6A, FIG. 6B is a graph for describing a process of obtaining an available voltage Va that may satisfy a condition for a predetermined lifespan tnd of the semiconductor device. When the total amount of stress that the available voltage Va computes is referred to as an available stress Sa, the available stress Sa may be equal to or less than the first to third stresses S1, S2, and S3. The predetermined lifespan tnd may be an intended or desired lifespan.

Referring to FIG. 6B, in this case, the available voltage Va is substantially a constant value, and accordingly, may be obtained by finding a k-th root of the result obtained by dividing the first to third stresses S1, S2, and S3 by the predetermined lifespan tnd. For example, since the first to third stresses S1, S2, and S3 are substantially the same, the available voltage Va may be determined according to Equation 4.

$$Va \leq \sqrt[k]{\frac{S1}{tnd}} = \sqrt[k]{\frac{S2}{tnd}} = \sqrt[k]{\frac{S3}{tnd}} \qquad \text{Equation 4}$$

That is, the available voltage Va may be determined as being equal to or less than a voltage value at the time when the available stress Sa is substantially the same as the first to third stresses S1, S2, and S3.

Regarding TDDB of the related art, a time after a voltage of a certain level is applied to a semiconductor device until the semiconductor device breaks down is measured, and the time is referred to as a breakdown time. In this regard, when the semiconductor device breaks down, an insulating layer present in the semiconductor device mainly breaks down, and thus, a failure such as an internal short-circuit occurs. For example, when voltages are applied across the gate electrode and the channel region of the semiconductor device or across two electrodes of the semiconductor device, an insulating layer between the gate and channel or the upper and lower electrodes may lose its electrical insulating properties, thereby causing the gate and channel or the upper and lower electrodes sandwiching the insulating layer to be electrically short-circuited.

In a TDDB test of the related art, distribution of breakdown times according to voltage is obtained by measuring breakdown times with respect to a plurality of different, constant voltage values with respect to a plurality of semiconductor devices that are substantially the same. A lifespan of a semiconductor device (e.g., a breakdown time at a usage voltage, etc.) is predicted by extrapolating, on a log scale, a value from the distribution of breakdown times according to voltage. In this regard, the lifespan of a semiconductor device is related to a semiconductor device breakdown that stochastically occurs, and measurement under a plurality of voltage conditions is required to obtain a reliable result. Accordingly, a time required for the TDDB test of the related art varies from at least one day to ten or more days, and it is difficult to acquire data beyond simple lifespan prediction due to lack of a measurement parameter.

However, in the method of testing a semiconductor device according to example embodiments, a voltage, a time period, etc. at a point of time when a semiconductor device breaks down are recorded while an applied voltage is increased at regular time intervals. Thus, a measurement time period may be dramatically decreased, and characteristics of semiconductor breakdown may be analyzed with a high degree of precision according to TDDB.

Figure 7:
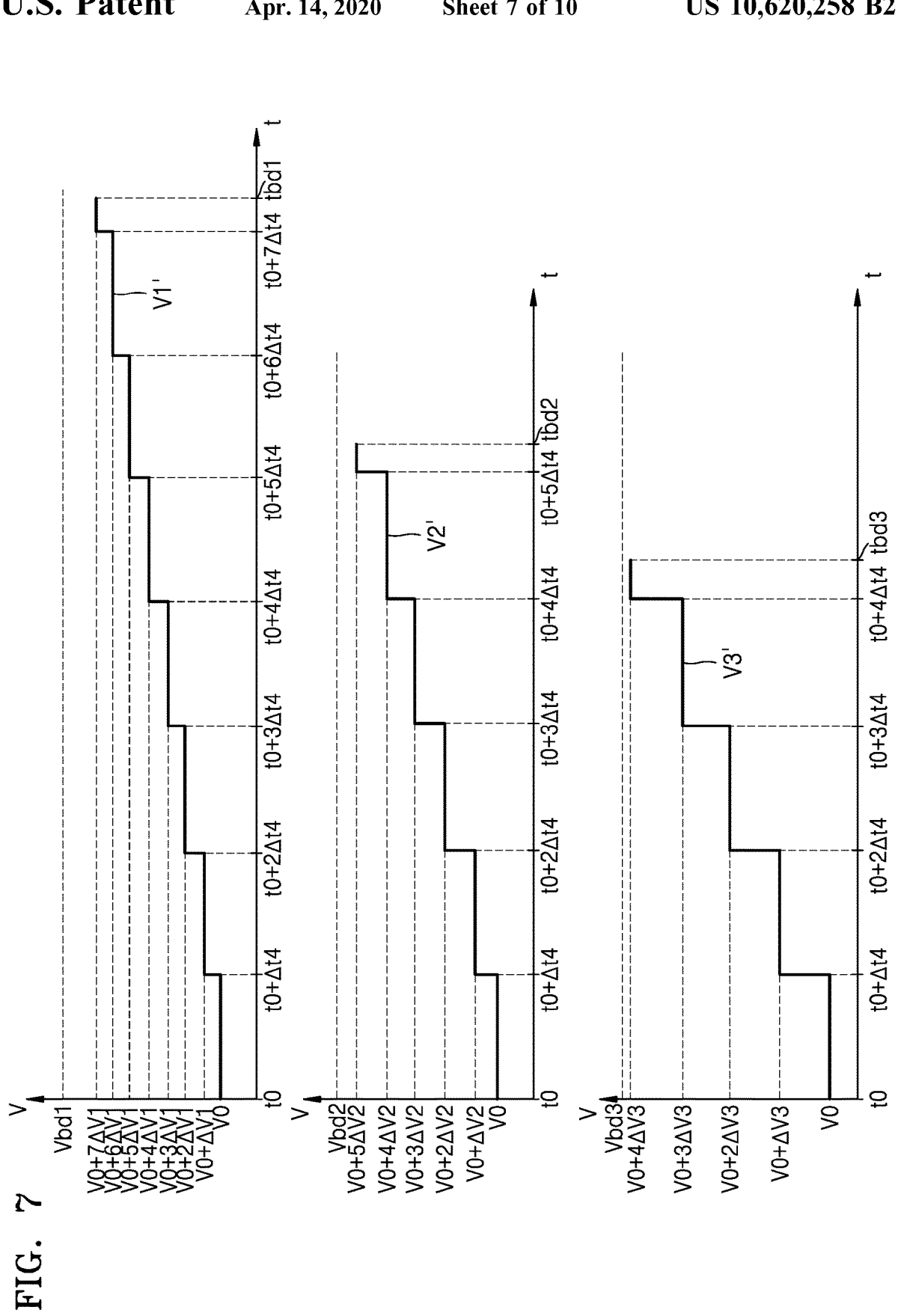
FIG. 7 is a graph for describing voltages that may be applied to a semiconductor device according to a method of testing a semiconductor device, according to example embodiments.

FIG. 7 shows graphs of first to third voltage sequences V1', V2', and V3' that may be applied to first to third semiconductor devices in order to describe a method of testing a semiconductor device, according to example embodiments.

For convenience of description, descriptions that are repetitive of FIGS. 2 to 6B will be omitted herein, and just differences will be mainly described below.

Referring to FIG. 7, the first to third voltage sequences V1', V2', and V3' may be functions of time starting at an initial time t0. The first to third voltage sequences V1', V2', and V3' may be functions of time including a monotonically increasing section. However, example embodiments are not limited thereto, and the first to third voltage sequences V1', V2', and V3' may include a decreasing section.

According to example embodiments, the first to third voltage sequences V1', V2', and V3' may be stepwise monotonically increasing functions. Values of the first to third voltage sequences V1', V2', and V3' may each increase at every fourth time interval Δt4. According to example embodiments, the fourth time interval Δt4 may be about 1 ms to about 10 s, but example embodiments are not limited thereto. In this example, the fourth time intervals Δt4 are intervals (or lengths) of time that are the same as one another.

According to example embodiments, voltage values may respectively increase as much as first to third voltage intervals ΔV1', ΔV2', and ΔV3' at every fourth time interval Δt4 of the first to third voltage functions V1'(t), V2'(t), and V3'(t). At least some of the first to third voltage intervals ΔV1', ΔV2', and ΔV3' may be different from each other. Each of the first to third voltage intervals ΔV1', ΔV2', and ΔV3' may be about 10 μV to about 0.01 V, but example embodiments are not limited thereto.

According to example embodiments, the first to third voltage functions V1'(t), V2'(t), and V3'(t) may be calculated according to Equation 5 below.

$$V1'(t) = V0 \cdot u(t - t0) + \sum_{n=1} \Delta V1' \cdot u(t - n\Delta t4 - t0)$$

$$V2'(t) = V0 \cdot u(t - t0) + \sum_{n=1} \Delta V2' \cdot u(t - n\Delta t4 - t0)$$

$$V3'(t) = V0 \cdot u(t - t0) + \sum_{n=1} \Delta V3' \cdot u(t - n\Delta t4 - t0)$$

Equation 5

The first to third voltage sequences V1', V2', and V3' are respectively applied to the first to third semiconductor devices until the first to third semiconductor devices break down, and maximum values of the first to third voltage functions V1'(t), V2'(t), and V3'(t) may be less than first to third breakdown voltages Vbd1, Vbd2, and Vbd3, which are voltages at which the first to third semiconductor devices break down.

Figure 8:
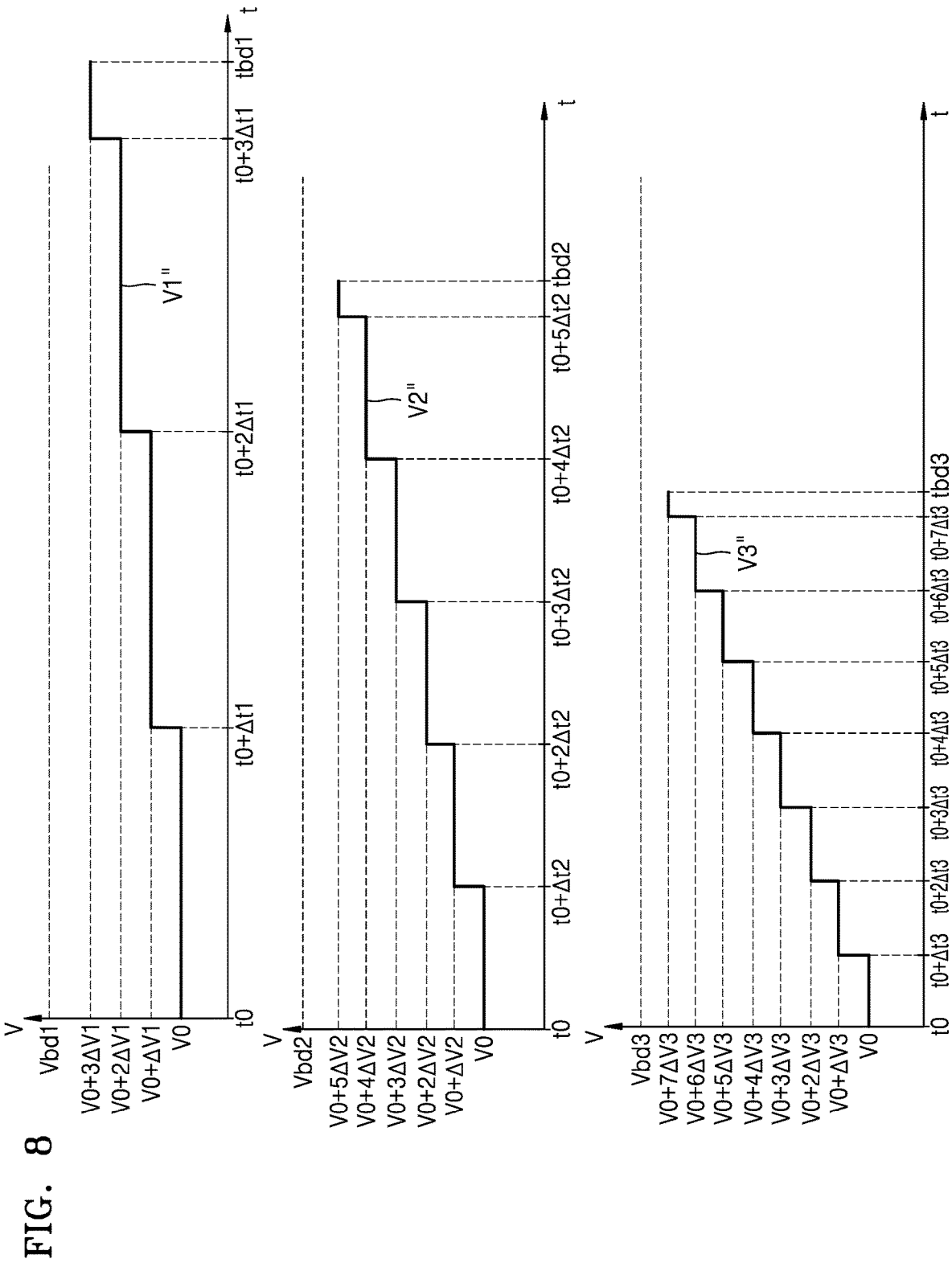
FIG. 8 is a graph for describing voltages that may be applied to a semiconductor device according to a method of testing a semiconductor device, according to example embodiments.

FIG. 8 shows graphs of first to third voltage sequences V1", V2", and V3" that may be applied to first to third semiconductor devices in order to describe a method of testing a semiconductor device according to example embodiments.

Referring to FIG. 8, the first to third voltage sequences V1", V2", and V3" may be functions of time starting at an initial time t0. The first to third voltage sequences V1", V2", and V3" may be functions including a monotonically increasing section. However, example embodiments are not limited thereto, and the first to third voltage sequences V1", V2", and V3" may include a decreasing section.

According to example embodiments, the first to third voltage sequences V1", V2", and V3" may be stepwise monotonically increasing functions. Values of the first to third voltage sequences V1", V2", and V3" may respectively increase at every first to third time intervals Δt1, Δt2, and Δt3. According to example embodiments, each of the first to third time intervals Δt1, Δt2, and Δt3 may be about 1 ms to about 10 s, but example embodiments are not limited thereto.

According to example embodiments, the first voltage sequence V1" may increase by as much as a first voltage interval ΔV1 every time the first time interval Δt1 lapses. The second voltage sequence V2" may increase by as much as a second voltage interval ΔV2 every time the second time interval Δt2 lapses. The third voltage sequence V3" may increase by as much as a third voltage interval ΔV3 every time the third time interval Δt3 lapses. Each of the first to third voltage intervals ΔV1, ΔV2, and ΔV3 may be different voltage intervals. For example, each of the first to third voltage intervals ΔV1, ΔV2, and ΔV3 may be about 10 μV to about 0.01 V, but example embodiments are not limited thereto. In this example, the first, second, and third time intervals Δt1, Δt2, and Δt3 may be intervals (or lengths) of time that are different from one another, but example embodiments are not limited thereto. In some embodiments, the first, second, and third time intervals Δt1, Δt2, and Δt3 may be intervals (or lengths) of time that are the same as one another.

According to example embodiments, each of the first to third voltage functions V1"(t), V2"(t), and V3"(t) may be calculated according to Equation 6 below.

$$V1''(t) = V0 \cdot u(t - t0) + \sum_{n=1} \Delta V1 \cdot u(t - n\Delta t1 - t0)$$

$$V2''(t) = V0 \cdot u(t - t0) + \sum_{n=1} \Delta V2 \cdot u(t - n\Delta t2 - t0)$$

$$V3''(t) = V0 \cdot u(t - t0) + \sum_{n=1} \Delta V3 \cdot u(t - n\Delta t3 - t0)$$

Equation 6

Figure 9:
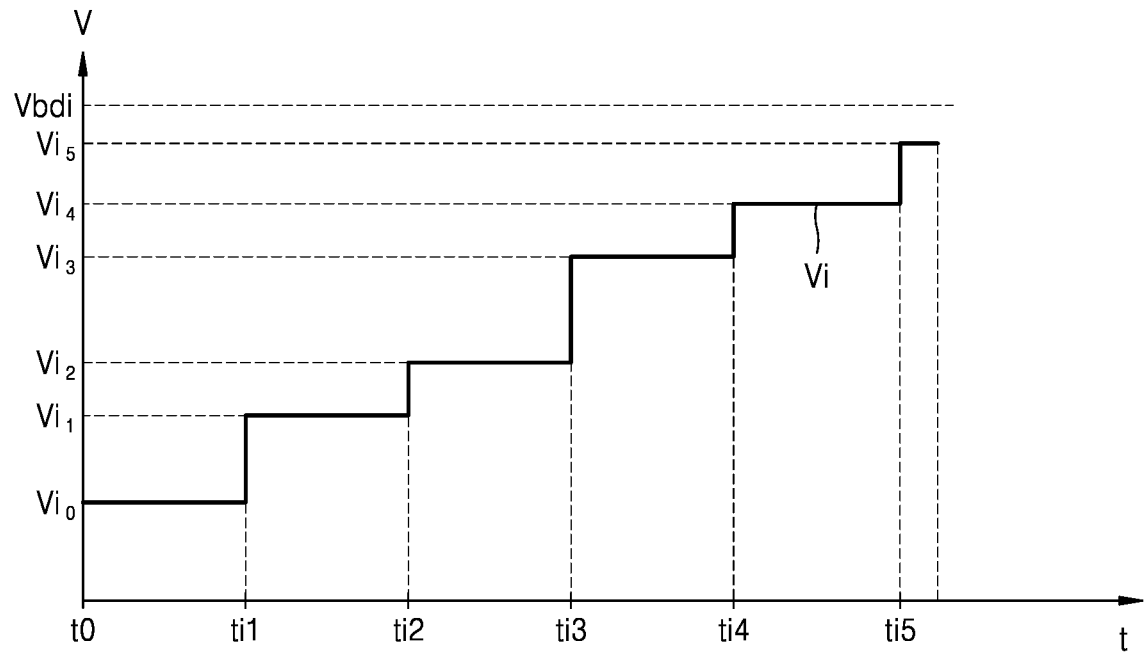
FIG. 9 is a graph for describing voltages that may be applied to a semiconductor device according to a method of testing a semiconductor device, according to example embodiments.

FIG. 9 is a graph showing a voltage that may be applied to a semiconductor device to describe a method of testing a semiconductor device, according to example embodiments.

According to example embodiments, a plurality of semiconductor devices may be tested. When an i-th voltage sequence Vi is applied to an i-th semiconductor device (where i is an integer equal to or greater than 1 and less than or equal to n), which is one of the plurality of semiconductor devices, a series of points of time that sequentially occur after an initial time t0, which is defined as a point of time at which the voltage starts to be applied, and the series of points of time at which a value of the i-th voltage changes may be defined as i_first to i_fifth times ti1, ti2, . . . , ti5. Differences between neighboring times may be different from each other. For example, a difference between the i_first time ti1 and the i_second time ti2 may be different from a difference between the i_second time ti2 and the i_third time ti3.

The value of the i-th voltage sequence Vi at the initial time t0 may be given as an initial voltage Vi$_0$, and the value of the voltage sequence Vi may change from Vi$_0$ to i_first to i_fifth voltages Vi$_1$, Vi$_2$, . . . , Vi$_5$ in this stated order at the i_first to i_fifth times ti1, ti2, . . . , ti5, respectively. The i-th voltage sequence Vi may be a function including a monotonically increasing section. The i_first to i_fifth voltages Vi$_1$, Vi$_2$, . . . , Vi$_5$ may be sequentially increasing values. A maximum value of the i-th voltage sequence Vi may be less than an i-th breakdown voltage. The i-th voltage function Vi(t), which may represent the i-th voltage sequence Vi, may be defined according to Equation 7.

$$Vi(t) = V0 \cdot u(t-t0) + \sum_{n=1} (Vi_n - Vi_{n-1}) \cdot u(t - t/n - t0) \quad \text{Equation 7}$$

Figure 10:
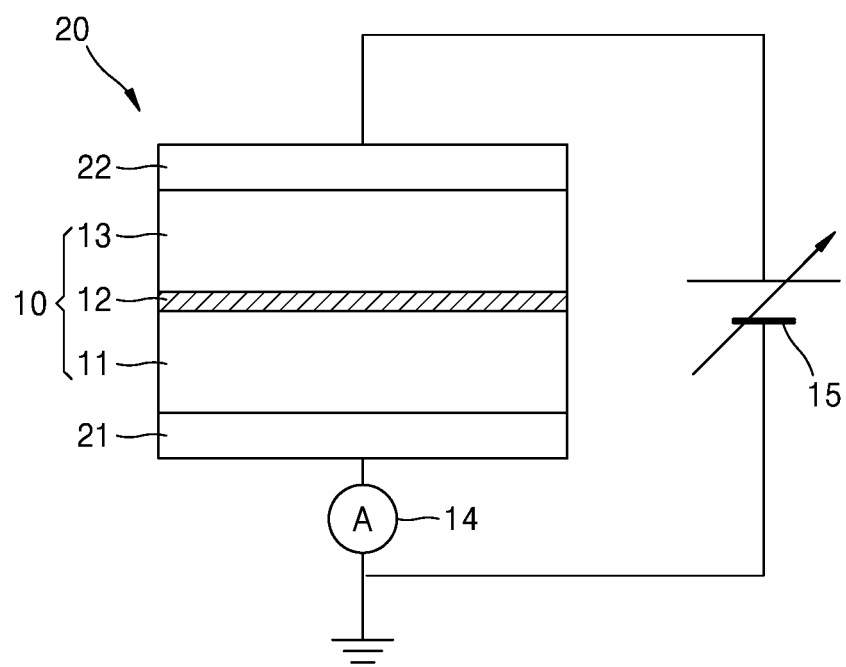
FIG. 10 is a cross-sectional view for describing a method of testing a semiconductor device, according to example embodiments.

FIG. 10 is a cross-sectional view for describing a method of testing a semiconductor device, according to example embodiments.

Referring to FIG. 10, a semiconductor device 20 to be tested may be a magnetic tunneling junction device.

The semiconductor device 20 may include a magnetic junction structure 10 between first and second electrodes 21 and 22, which are spaced apart from each other. The magnetic junction structure 10 includes a free layer 11, a fixed layer 13, and a tunneling barrier 12 therebetween. The free layer 11 has a magnetization easy axis in a direction perpendicular to the top surface of the free layer 11, and a magnetization direction thereof may change according to a condition. The fixed layer 13 has a magnetization easy axis in a direction perpendicular to the top surface of the fixed layer 13, and a magnetization direction thereof is fixed.

A resistance value of the magnetic junction structure 10 changes according to the magnetization direction of the free layer 11. When a magnetization direction at the free layer 11 and a magnetization direction at the fixed layer 13 are parallel to each other, the magnetic junction structure 10 has a low resistance value and may store data '0'. When a magnetization direction at the free layer 11 and a magnetization direction at the fixed layer 13 are antiparallel to each other, the magnetic junction structure 10 has a high resistance value and may store data '1'.

For example, a ground potential is connected to the first electrode 21, and a variable power supply 15 is connected between the second electrode 22 and the ground potential and applies a voltage therebetween. An ammeter 14 may be connected between the first electrode 21 and the ground potential to measure a current value. In this regard, breakdown of the semiconductor device 20 may be determined depending on whether the current value exceeds a predetermined numerical value.

For example, a voltage sequence may be applied across two electrodes of a semiconductor device 20 until an insulating layer that is sandwiched between the two electrodes loses its electric insulating properties, thereby causing the two electrodes sandwiching the insulating layer to be electrically short-circuited. The insulating layer may be determined to have lost its electric insulating properties, and the semiconductor device 20 has reached "breakdown", when the calculated current value exceeds the predetermined numerical value.

Figure 11:
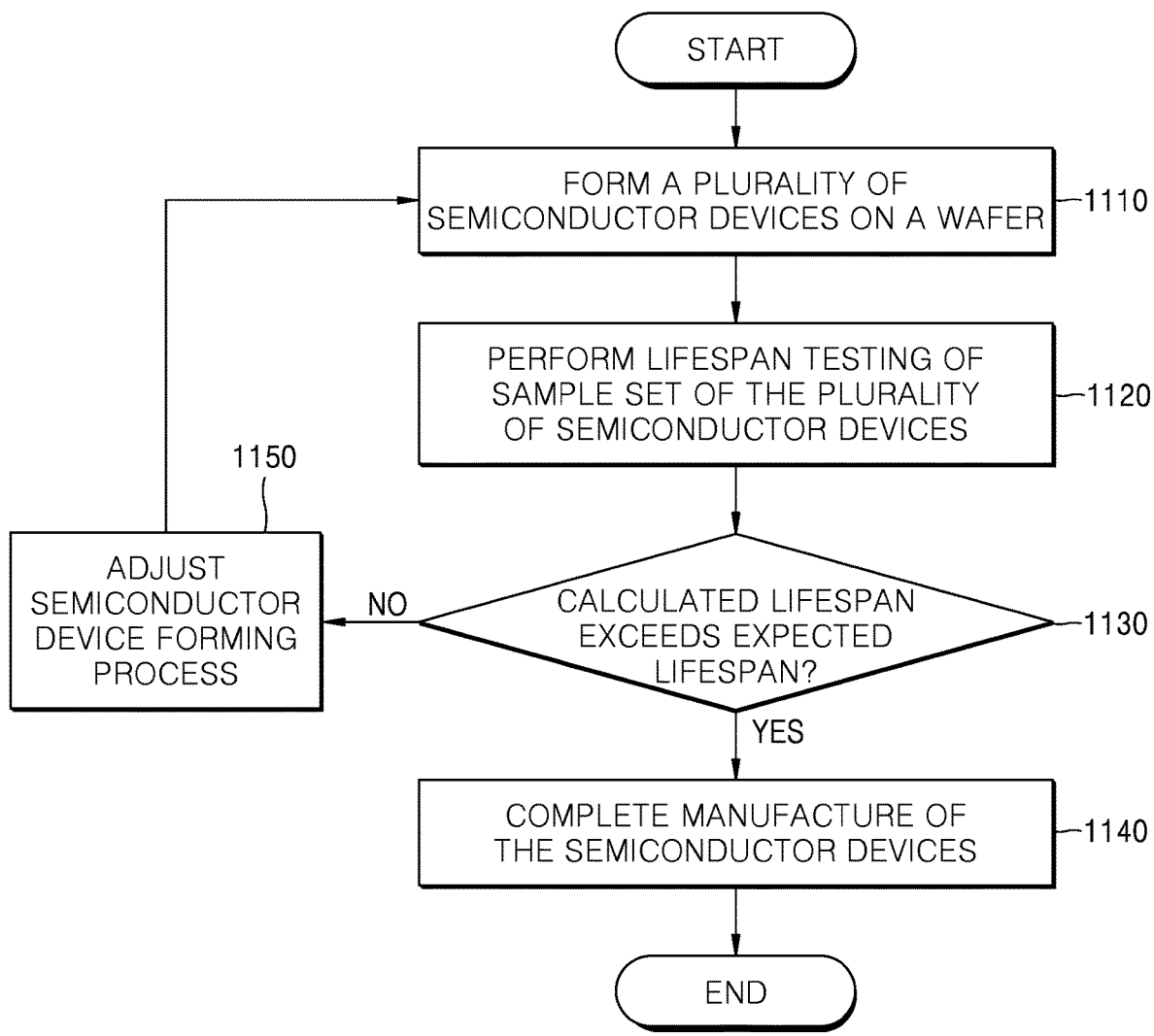
FIG. 11 is a method of manufacturing semiconductor devices using the method of testing a semiconductor device, according to example embodiments.

FIG. 11 illustrates a method of manufacturing semiconductor devices using the method of testing a semiconductor device to determine a lifespan of the semiconductor device, according to certain exemplary embodiments.

First, a plurality of semiconductor devices may be formed on a wafer (step 1110). The formation of the plurality of semiconductor devices may include one or more processes, such as, for example, etching processes, photolithography processes, CMP processes, etc. The plurality of semiconductor devices may be substantially the same. For example, the plurality of semiconductor devices may be a same type of device, each having insulating layers that are substantially the same in shape, size, and production processes with one another.

Next, the plurality of semiconductor devices may be provided to the testing module 1030, where a subset of the plurality of semiconductor devices may be tested (step 1120). The semiconductor devices may be tested according to the systems and processes discloses herein. Subsequently, when the lifespan calculated during testing is determined to be greater than an expected lifespan (e.g., a warranty period) (step 1130, Yes), additional processing may be performed on the wafer (step 1140). For example, additional layers may be deposited on the wafer to form semiconductor chips, the semiconductor chips may then be singulated, packaged on a package substrate, and encapsulated by an encapsulant to form a semiconductor device. When the lifespan calculated during testing is determined to be less than an expected lifespan (e.g., a warranty period) (step 1130, No), the semiconductor forming process may be modified (step 1150), and a plurality of semiconductor devices may be formed on a wafer using the modified semiconductor forming process (step 1110).

Methods of testing a semiconductor device include a method of using properties of a semiconductor located at an interface of an insulator and a method of using capacitor characteristics. For this, a semiconductor device having a large area for analysis had to be manufactured, or semiconductor devices had to be measured via a parallel connection. However, in the case of a resistance device, when a resistance device having a large size is manufactured, or resistance devices are connected in parallel, a resistance decreases rapidly, thereby making precise analysis difficult. In the method of testing a semiconductor device according to the example embodiments, a semiconductor device may be measured as-is without being necessary to use a parallel connection or large-size manufacture, and thus, a statistical analysis may be performed even in the case of a resistance device.

Also, when a semiconductor device has a metal-insulator-metal (MIM) structure instead of a semiconductor-insulator-metal (SIM) structure as shown in FIG. 10, it is impossible to analyze an electrical structure defect via analysis of a lattice defect, etc. However, according to the method of testing a semiconductor device according to the example embodiments, a plurality of semiconductor devices may be tested owing to a high test speed, and further, an electrical defect structure may be analyzed based on a plurality of pieces of test data.

While the concepts have been particularly shown and described with reference to the example embodiments thereof, it will be understood that various changes in form and details may be made therein without departing from the spirit and scope of the following claims.

What is claimed is:

1. A method of manufacturing semiconductor devices, the method comprising:

applying first to n-th voltage sequences to first to n-th semiconductor devices, respectively, until the first to n-th semiconductor devices break down;

calculating first to n-th stresses that define a total amount of stress respectively applied to the first to n-th semiconductor devices until a time when the first to n-th semiconductor devices break down, respectively, after the first to n-th voltage sequences are applied;

calculating an expected lifespan of the first to n-th semiconductor devices by using the first to n-th stresses;

determining whether the expected lifespan calculated for the first to n-th semiconductor devices is greater than a desired lifespan; and forming at least one semiconductor chip using at least one of the first to n-th semiconductor devices when the expected lifespan calculated for the first to n-th semiconductor devices is determined to be greater than the desired lifespan, wherein the first to n-th stresses are respectively calculated as a function of the first to n-th voltage sequences applied to the first to n-th semiconductor devices, wherein each of the first to n-th voltage sequences include multiple voltage values that change according to time, wherein the first to n-th semiconductor devices are a same type, and wherein each of the first to n-th semiconductor devices includes a magnetic tunneling junction structure comprising a free layer and a fixed layer.

2. The method of claim 1, wherein the first to n-th stresses are a same stress.

3. The method of claim 1, wherein each of the first to n-th voltage sequences comprises a section that monotonically increases with time.

4. The method of claim 1, wherein each of the first to n-th voltage sequences comprise monotonically increasing sections having a step shape that increases at each of first to n-th voltage intervals.

5. The method of claim 4, wherein the first to n-th voltage intervals are a same voltage interval.

6. The method of claim 4, wherein each of the first to n-th voltage intervals is equal to or greater than 10 μV and less than or equal to 0.01 V.

7. The method of claim 4, wherein each of the first to n-th voltage sequences increases monotonically and each of the first to n-th voltage sequences has an overall step shape.

8. The method of claim 1, wherein the first to n-th voltage sequences change at predetermined first to n-th time intervals, respectively, and wherein at least some of the first to n-th time intervals are different from each other.

9. The method of claim 8, wherein each of the first to n-th time intervals is equal to or greater than 1 ms and less than or equal to 10 s.

10. The method of claim 9, wherein the calculating the first to n-th stresses comprises finding a constant value k, wherein k is a positive real number satisfying Equation 1 below, so that the first to n-th stresses have a substantially same value, $$S_i = \int v_i^k(t) dt \quad \text{(Equation 1)}$$

where $S_i$ is an i-th stress, $V_i(t)$ is an i-th voltage, k is a constant value, and i is an integer equal to or greater than 1 and less than or equal to n.

11. The method of claim 10, wherein the calculating the expected lifespan of the first to n-th semiconductor devices by using the first to n-th stresses comprises calculating times used for calculating the first to n-th stresses by inserting voltages at which the first to n-th semiconductor devices operate in Equation 1.

12. The method of claim 1, wherein maximum values of the first to n-th voltage sequences are less than first to n-th breakdown voltages, respectively, which are respective breakdown voltages of the first to n-th semiconductor devices.

13. The method of claim 1, wherein the first to n-th voltage sequences are applied simultaneously to the first to n-th semiconductor devices.

14. A method of manufacturing semiconductor devices, the method comprising:

applying first to third voltage sequences, each having a stepwise shape, to first to third semiconductor devices, respectively, until the first to third semiconductor devices break down;

calculating first to third stresses that respectively define a total amount of stress applied until the first to third semiconductor devices break down;

determining whether an expected lifespan of the first to third semiconductor devices is greater than a desired lifespan based on the calculated first to third stresses; and forming at least one semiconductor chip using at least one of the first to third semiconductor devices when the expected lifespan of the first to third semiconductor devices is determined to be greater than the desired lifespan, wherein the first to third stresses are respectively calculated as a function of the first to third voltage sequences applied to the first to third semiconductor devices, wherein a highest value of each of the first to third voltage sequences respectively applied to the first to third semiconductor devices is less than respective first to third breakdown voltages, wherein the first to third breakdown voltages are respective voltages at which the first to third semiconductor devices immediately break down, and wherein each of the first to third semiconductor devices includes a magnetic tunneling junction structure comprising a free layer and a fixed layer.

15. The method of claim 14, wherein each of the first to third voltage sequences increases in a stepwise manner, and wherein voltage change values of the first to third voltage sequences are a same voltage change value.

16. The method of claim 14, wherein first to third time intervals, which are time intervals during which the first to third voltage sequences are maintained at predetermined voltage values, are different from one another.

17. The method of claim 14, wherein the first to third voltage sequences are applied simultaneously to the first to third semiconductor devices.

18. A method of manufacturing semiconductor devices, the method comprising:

applying a first voltage sequence to a first semiconductor device until the first semiconductor device breaks down, wherein the first voltage sequence includes multiple first voltage values that change according to time;

applying a second voltage sequence to a second semiconductor device until the second semiconductor device breaks down, wherein the second voltage sequence includes multiple second voltage values that change according to time;

calculating a first stress that defines a total amount of stress applied to the first semiconductor device until the first semiconductor device breaks down after the first voltage sequence is applied;

calculating a second stress that defines a total amount of stress applied to the second semiconductor device until the second semiconductor device breaks down after the second voltage sequence is applied;

calculating an expected lifespan of the first and second semiconductor devices based on the first and second stresses;

determining whether the expected lifespan calculated for the first and second semiconductor devices is greater than a desired lifespan; and forming, when the expected lifespan of the first and second semiconductor devices is determined to exceed the desired lifespan, at least one semiconductor chip using at least one of the first and second semiconductor devices, wherein the first stress is calculated as a function of the first voltage sequence applied to the first semiconductor device, wherein the second stress is calculated as a function of the second voltage sequence applied to the second semiconductor device, and wherein each of the first and second semiconductor devices includes a magnetic tunneling junction structure comprising a free layer and a fixed layer.

19. The method of claim 18, wherein each of the first voltage sequence and the second voltage sequence comprises monotonically increasing sections, and wherein each of the first voltage sequence and the second voltage sequence has an overall step shape.

20. The method of claim 18, wherein the first voltage sequence changes at predetermined first time intervals, wherein the second voltage sequence changes at predetermined second time intervals, and wherein the predetermined first time intervals are different from the predetermined second time intervals.

\* \* \* \* \*